US010416243B2

(12) United States Patent
Nelson et al.

(10) Patent No.: US 10,416,243 B2
(45) Date of Patent: Sep. 17, 2019

(54) TEST CONFIGURATION FOR EMERGENCY LIGHTING FIXTURES

(71) Applicant: ABL IP Holding LLC, Atlanta, GA (US)

(72) Inventors: Kenneth Edwin Nelson, Stone Mountain, GA (US); Michael G. Hanley, Lawrenceville, GA (US)

(73) Assignee: ABL IP Holding LLC, Atlanta, GA (US)

( * ) Notice: Subject to any disclaimer, the term of this patent is extended or adjusted under 35 U.S.C. 154(b) by 33 days.

(21) Appl. No.: 15/724,558

(22) Filed: Oct. 4, 2017

(65) Prior Publication Data

US 2018/0095142 A1    Apr. 5, 2018

Related U.S. Application Data

(60) Provisional application No. 62/404,281, filed on Oct. 5, 2016.

(51) Int. Cl.
| | | |
|---|---|---|
| *G01R 31/44* | (2006.01) | |
| *G08B 1/08* | (2006.01) | |
| *H05B 37/03* | (2006.01) | |
| *H05B 37/02* | (2006.01) | |

(52) U.S. Cl.
CPC ......... *G01R 31/44* (2013.01); *H05B 37/0272* (2013.01); *H05B 37/03* (2013.01)

(58) Field of Classification Search
CPC .................................................... G01R 31/44
See application file for complete search history.

(56) References Cited

U.S. PATENT DOCUMENTS

| | | |
|---|---|---|
| 6,538,568 B2 | 3/2003 | Conley, III |
| 7,321,302 B2 * | 1/2008 | Beghelli ................ G08B 7/062 340/539.17 |
| 7,940,010 B2 | 5/2011 | Patterson |

OTHER PUBLICATIONS

Cooper Automated Lighting, "Emergency Lighting Design Guide," available online at http://www.iar.unicamp.br/lab/luz/Id/Seguran%E7a/emergency_lighting_design_guide.pdf, pp. 441-451.
Engineering Project Group, "Emergency Lighting: A Best Practice Guide," Consortium Local Authorities Wales, Mar. 2011, 14 pages.
(Continued)

*Primary Examiner* — Minh Q Phan
(74) *Attorney, Agent, or Firm* — Kilpatrick Townsend & Stockton LLP

(57) ABSTRACT

Aspects are described for a test configuration for emergency lighting fixtures. In one example, a light fixture includes a lighting element, a battery, a clock, and a processor. The processor is configurable via a user interface. The processor is configured to test the light fixture. The testing includes illuminating the lighting element for a predetermined duration using the battery as a power source. The testing is initiated by a timer that uses the clock. The processor of the light fixture receives input, via the user interface, adjusting a value for the start timer. Based on the start timer expiring, the processor initiates a test of the light fixture for the predetermined duration. The processor further indicates a result of the test via the user interface. Based on the test being successful, the processor resets the start timer.

20 Claims, 3 Drawing Sheets

(56) References Cited

OTHER PUBLICATIONS

Primex Wireless, "Application Management Platform (AMP), Emergency Lights Module, User Guide," Primex Wireless, Inc., Apr. 10, 2014, 56 pages.

Thomas & Betts, "Emergency Lighting Guide: An authoritative guide to emergency lighting systems and design techniques," available online at http://www-public.tnb.com/eel/docs/emergilite/Emergi-Lite_Emergency_Lighting_Design_Guide.pdf, 2013, 84 pages.

\* cited by examiner

TEST CONFIGURATION FOR EMERGENCY LIGHTING FIXTURES

CROSS-REFERENCE TO RELATED APPLICATIONS

This application claims priority to U.S. Provisional Application Ser. No. 62/404,281 filed Oct. 5, 2016 and titled "Test Configuration for Emergency Lighting Fixture," the contents of which are hereby incorporated by reference.

TECHNICAL FIELD

This disclosure relates generally to lighting fixtures. More specifically, and not by way of limitation, this disclosure relates to configuring testing for emergency lighting fixtures.

BACKGROUND

Emergency lighting fixtures exist to provide egress lighting if building power fails. In order to meet this need, common practice for emergency lighting fixtures is to include some form of battery-powered lighting. Building codes and/or other standards may specify various requirements for testing the capability of emergency lighting fixtures to provide lighting while operating on battery power. For example, building requirements may specify that the emergency lighting tests should be conducted monthly for a test duration of five minutes and annually for a test duration of 90 minutes. While the tests may be initiated manually, certain emergency lighting fixtures incorporate self-diagnostic functionality, such that each fixture itself initiates testing at the required intervals and durations. But the time at which such emergency lighting fixtures initiate the test is not configurable, thereby resulting in the possibility of the fixtures conducting tests at inconvenient or unsatisfactory times. For example, emergency lighting fixtures used in a cinema may cause a significant disruption by initiating such tests during a showing of a movie. Accordingly, the ability to configure the emergency lighting fixtures with one or more times during which testing should or should not occur is needed.

SUMMARY

Systems are described herein for a light fixture. In an example, a light fixture includes a lighting element, a battery, a clock, and a processor. The processor is configurable via a user interface. The processor is configured to detect, using the clock, an expiration of a start timer having an initial value. Responsive to the expiration of the start timer having the initial value, the processor is configured to perform a test of the light fixture. The test comprises illuminating the lighting element for a predetermined duration using the battery as a power source. The processor is configured to receive input, via the user interface, adjusting the start timer from the initial value to a modified value. Responsive to an expiration of the start timer having the modified value, the processor is configured to initiate a subsequent test of the light fixture for the predetermined duration. The processor is further configured to configure the user interface to indicate a result of the subsequent test via the user interface. The processor is further configured to reset the start timer, based on the subsequent test being successful for the light fixture.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Systems and methods described herein use a clock and a processor configurable via user interface to configure self-diagnostic testing for emergency lighting fixtures. As discussed above, existing solutions for emergency lighting use self-diagnostic features, but do not permit the stand-alone configuration of the time at which testing is initiated (e.g., configuration via a tactical input, infrared remote, short-term provisioning session, etc.). Existing solutions may thereby conduct tests at inconvenient or unsatisfactory times. Accordingly, embodiments described herein facilitate the testing of emergency light fixtures using time-configurable, self-diagnostic testing.

Figure 1:
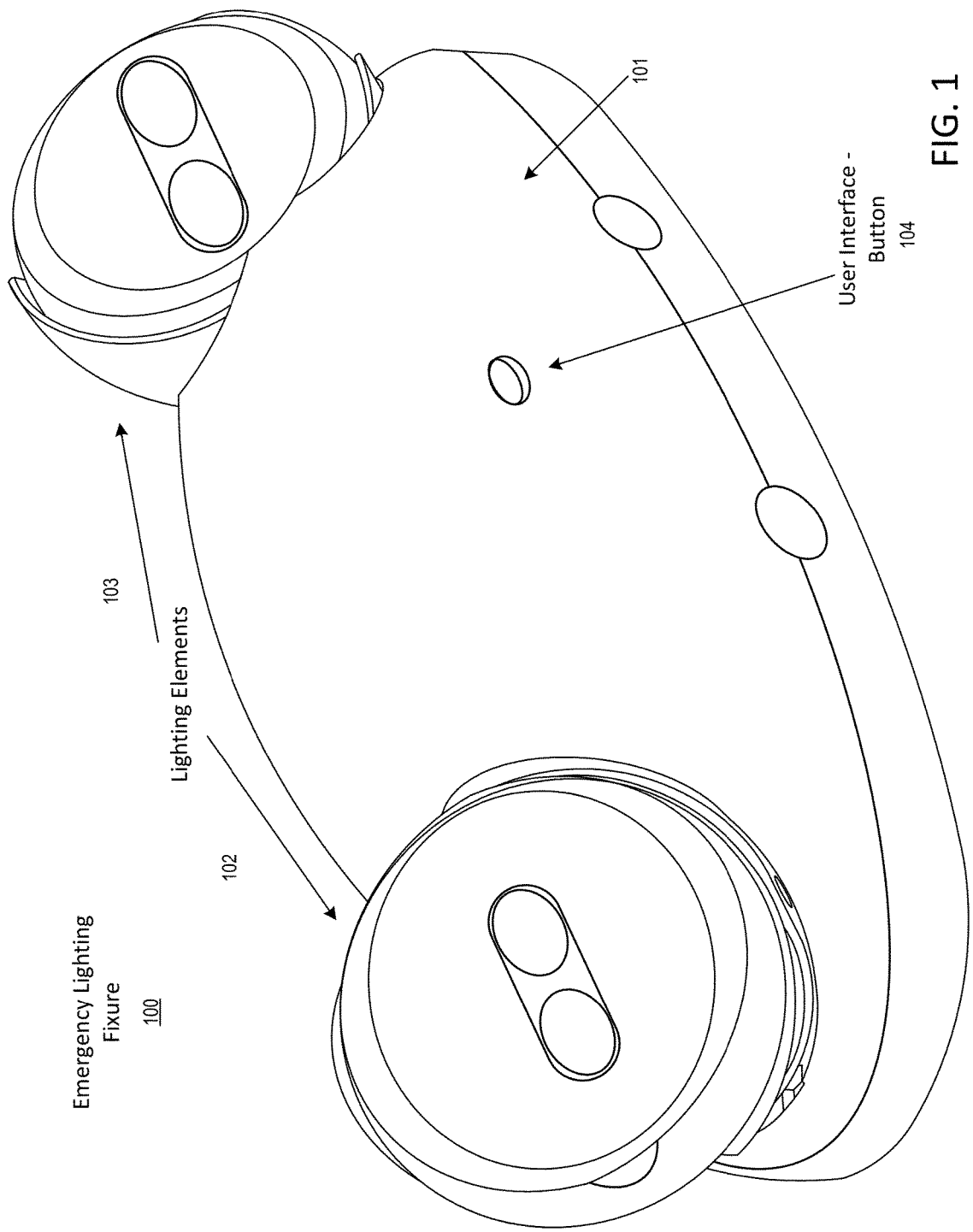
FIG. 1 depicts an example of an emergency lighting fixture implementing time-configurable, self-diagnostic testing, according to certain aspects of the present disclosure.

Certain embodiments involve an emergency lighting fixture capable of performing self-diagnostic lighting tests at a time that is configurable via a user interface of the lighting fixture. FIG. 1 illustrates an example of an emergency lighting fixture 100 implementing the time-configurable, self-diagnostic testing disclosed herein. This example of the emergency lighting fixture includes a chassis 101 onto which two lighting elements 102 and 103 are installed. Each lighting element 102-103 may include one or more light emitting diodes (LEDs), tunable fluorescent lamps, incandescent lamps, and/or other light emitting devices.

The emergency lighting fixture 100 can also include a user interface for allowing programming of the emergency lighting fixture 100, for providing feedback to an operator, or both. In some aspects, the operator interface can include input elements, output elements, or both. Input elements can include any suitable device, mechanism, or other component that allows an operator to provide commands or data to a processing device of the lighting fixture 100. Examples of input elements include buttons, switches, wireless receiving devices (e.g., a diagnostic port or infrared port), etc. Output elements can include any suitable device, mechanism, or other component that provides one or more sensory indicators (e.g., a colored light, a readable message, an audible tone, an audible message, a vibration, etc.) to an operator in response to one or more operations performed by a processing device of the light fixture 100 or other components of the light fixture 100. Examples of output elements include a lighting element (e.g., an LED), a display screen, a speaker, etc.

For instance, in the example shown in FIG. 1, a depressible button 104 serves as an input element of the user interface. In some aspects, a depressible button 104 having one or more lighting elements may also serve as an output element by illuminating, thereby providing feedback to an operator. Other user interfaces are possible instead of or in addition to button shown in the example, such as a touch-sensitive display, a wireless remote control or other wireless receiver device lacking a persistent connection to a network, one or more switches and/or buttons, and/or other possible user interface components. As can be appreciated, the emergency lighting fixture 100 of FIG. 1 is merely an example and other configurations are possible.

Different interfaces are possible. For example, a tactile switch or button could be used to interact with the emergency lighting fixture 100. One push of the button could reset the timer, for example. Two pushes of a button could increment the timer by one hour.

Input can also be received by the emergency lighting fixture 100 via a provisioning session. In a provisioning session, a wireless or wired connection is created only during the session and for the purpose of providing inputs to the emergency lighting fixture 100 for modifying one or more test features (e.g., the timer value). Examples of wireless connection methods include a WiFi, near-field communication, Bluetooth, a connection via a diagnostic port having a wireless transceiver, etc.

Wireless devices such as Bluetooth devices may be enabled for provisioning sessions only. A provisioning session is a short-term session that is initiated for the specific purposes of providing configuration inputs (e.g., updated timer values) to the emergency lighting fixture 100, receiving configuration outputs (e.g., test results) from the emergency lighting fixture 100, or both. A provisioning session initializes in order to receive user input, receives user input, and then terminates following receiving the requisite user input. In one example, a provisioning session can be configured by a point to point network between the emergency lighting fixture and a wireless device. A user's device communicates by Bluetooth to the emergency lighting fixture, sends the user's desired timer value, and terminates the connection.

In another example of a provisioning session, an operator approaches the emergency lighting fixture 100 with a mobile device having Bluetooth or another wireless communication protocol enabled. The mobile device executes a software application that establishes a provisioning session. Using the software application, the operator could set the timer value. The provisioning session is terminated after the emergency lighting fixture 100 is configured, and the emergency lighting fixture 100 can proceed with standalone operations (e.g., without being connected to a network to perform its normal operations). Thus, the emergency lighting fixture 100 can operate without a persistent connection to a wired or wireless data network.

Emergency lighting fixtures may be configured at the time of manufacture to conduct emergency lighting tests (or simply "tests") at defined time intervals following installation, such as a monthly five-minute test and a yearly 90-minute test. During the tests, the emergency lighting fixture may operate the lighting elements for the prescribed duration while powered by a battery stored within the fixture. If the emergency lighting fixture has successfully passed all required tests, the user interface may indicate this state by, for example, illuminating a button with a green color. If the fixture has failed and/or has not performed one or more of the tests, the user interface may indicate this state by, for example, illuminating the button with a red color. Though various different implementations are possible, the emergency lighting fixture may default to conducting the tests (e.g., monthly and yearly) at the time of day in which the fixture is installed and/or the time of day at which the test was last initiated manually. An operator can configure the emergency lighting fixture with a new time of day at which the monthly and yearly tests should be conducted via the user interface for the fixture, such as the button shown.

For example, an installed emergency lighting fixture is currently configured to perform a monthly test every month at 2 p.m. and an annual test every year at 2 p.m. (It should be noted that the emergency lighting fixture may not be configured with the current time of day, and may instead be configured simply to conduct a monthly test on a 30-day interval, at a time which happens to be 2 p.m.). An operator may instead decide that performing the testing at 6 p.m. is more suitable. The emergency lighting fixture can be programmed to schedule the testing to occur at a different time of day. For instance, programming logic of the emergency lighting fixture can receive one or more inputs via the interface, such as (but not limited to) a defined sequence of button presses (e.g., a short press, followed by two long presses).

The programming logic can respond to the inputs by causing the fixture to enter a testing schedule configuration mode. If the emergency lighting fixture is in this testing schedule configuration mode, the operator can set the amount of time to be earlier and/or later from the current time of day at which the tests are conducted. For example, the emergency lighting fixture can be programmed to set the desired amount of time via the user interface. In one example, pressing a button once causes the testing time to be two hours later. Thus, the operator can press the button two times to indicate that the test should be conducted four hours later at 6 p.m. The emergency lighting fixture may implement a 24-hour rollover in order to prevent the test being delayed more than one day. Once the testing time adjustment is complete, the operator may enter another defined sequence of button presses on the emergency lighting fixture (or simply press no buttons for a period of time) in order to cause the fixture to exit the testing schedule configuration mode. Thereafter, the fixture may illuminate the button to confirm the change, such as flashing the button one time for each two hours of adjustment made to the time of day for testing.

As can be appreciated, the manner in which adjustments are made to the time of day to conduct the test may vary depending upon the type of user interface with which the operator performs the configuration. In one example, using a touch-sensitive display, an operator may simply enter a number of hours for which the testing time should be adjusted. In another example, the operator may enter a precise time of day, or an absolute time, (e.g., "6 p.m.") to conduct the test, in the event the fixture is configured with the current time of day.

Figure 2:
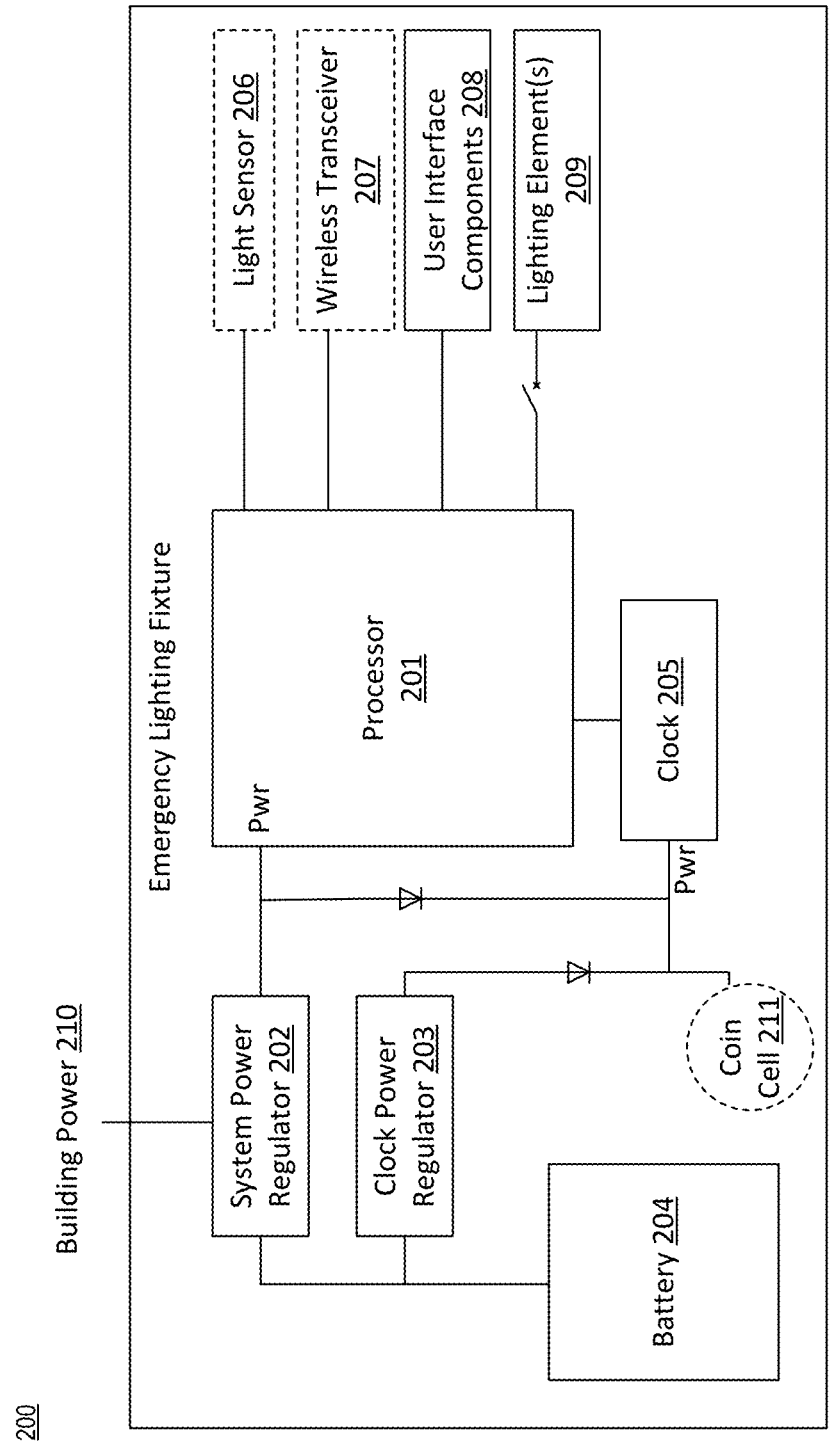
FIG. 2 is a block diagram depicting an example circuit of an emergency light fixture, according to certain aspects of the present disclosure.

FIG. 2 is a block diagram depicting an example circuit of an emergency light fixture. Circuit 200 includes a processor 201, a system power regulator 202, a clock power regulator 203, a battery 204, a clock 205, a light sensor 206, a wireless transceiver 207, user interface components 208, and lighting elements 209. During normal operation, an installed emergency lighting fixture can receive electrical power from the building, e.g., building power 210 via a system power regulator.

The system power regulator 202 includes circuitry that can manage the power for the fixture. During normal operation, the building power 210 provides power to keep the battery 204 for the fixture charged and provides power used by the processor 201 and the clock 205 for the fixture. The wireless transceiver 107 may or may not be connected to a network.

The clock is circuitry that allows the processor to maintain a measure of time. An example of the clock 205 includes a real-time clock (RTC), which may use a crystal oscillator. For illustrative purposes, FIG. 2 depicts the clock 205 separately from the processor 201. But other implementations are possible. In some embodiments, the clock 205 may be integrated as a component of the processor 201.

During a failure in the building power, the system power regulator 202 provides power from the battery 204 to the processor 201 and the clock 205. Based on the available power remaining in the battery reaching 204 a minimum threshold (e.g., a low-battery condition), the system power regulator 202 may also cease providing power to the processor 201 and the clock 205 in order to preserve longevity of the battery.

The clock power regulator 203 is circuitry that provides an alternate source of power for the clock 205. The clock power regulator can also receive power from the battery 204. The clock power regulator 203 can provide the clock 205 with a continuous source of power from the battery 204 if the system power regulator 202 ceases providing power to the clock 205. The power consumed by the clock 205 is less than the power consumed by the processor 201 and lighting elements 209. Thus, while a low battery condition may be insufficient power to continue operating the processor 201, the low battery condition may be sufficient to power the clock 205 for extended periods (e.g., weeks or months) without damage to the battery 204. In some implementations, the emergency lighting fixture 100 may use a coin cell battery 211, or some other secondary battery (i.e., a battery separate from battery 204), to provide power to the clock 205, which may be used instead of or in addition to the clock power regulator 203.

The processor 201 can manage operation of the lighting elements 209 for the emergency light fixture 100, including managing performance of the lighting tests at the required intervals and other tasks not discussed in detail. The processor 201 can be communicatively coupled to other components of the emergency lighting fixture 100 via a bus, a printed circuit board, or any other suitable structure or device (not illustrated in FIG. 2). The processor 201 can include any suitable device or group of devices configured to execute code stored on a computer-readable medium. Examples of processor include a microprocessor, a mixed signal microcontroller, an application-specific integrated circuit ("ASIC"), a field-programmable gate array ("FPGA"), or another suitable processing device.

The user interface components 208 can be used to configure the processor 201, including configuring the time of day at which to conduct the tests (e.g., monthly and yearly) of the fixture. Examples of the user interface components include depressible and/or illuminating buttons, a touch-sensitive display, switches, a wireless remote control, etc. The user interface components 208 allow the operator to provide input, such as through buttons, as well as receive status output, such as through an LED or other display device.

In some implementations, the emergency lighting fixture 100 also includes a wireless transceiver and/or a light sensor. The wireless transceiver includes one or more devices that can wirelessly transmit signals, receive signals, or both. For example, the wireless transceiver not connected to a network can communicate with another device to use various wireless protocols (e.g., Zigbee, Bluetooth, WiFi, infrared, etc.) to configure the processor 201 and to receive status from the fixture. The light sensor can provide the fixture with a measurement of the amount of ambient light in the proximity of the fixture in order to make intelligent decisions related to the need for operating the lighting elements. For example, the processor 201 may determine, based on data received from the light sensor, that the lighting elements should not be illuminated while the amount of ambient light meets a minimum threshold.

As discussed above, the emergency lighting fixture 100 can receive input via the user interface components 208, such as buttons, that can be used by the processor to configure the time of day at which the tests should be conducted. Using the clock 205, the processor 201 configures a timer for the tests based on the adjustment entered by the operator. For example, if the timer that initiates the monthly test of the fixture is set to trigger in six hours, the operator can provide input to adjust the timer value to cause the test to be initiated sooner or at a later time, such as up to 24 hours later. In some implementations, the fixture incorporates limits to the timer adjustments prior to a given test to prevent, for example, perpetually delaying the test 24 hours each day. In addition, the separate power source provided to the clock 205 can allow timer values to be preserved even in if interruptions to the building power 210 prevent the building power 210 from powering the processor 201.

For example, if the timer that initiates the monthly test of the fixture is set to trigger in six hours, and the building power fails for three hours, the battery may not have sufficient reserves to power the processor (and possibly the lighting elements) for this entire three-hour length of time. Thus, the system power regulator may eventually reduce or cut power to the processor and other component of the fixture prior to building power being restored. However, because the clock 205 has a separate source of power (e.g., the clock power regulator 203, a coin cell battery 211, etc.), the clock 205 continues to operate maintaining a count of the time that elapses. For example, if the power is restored after the three hour outage of the building power, an accurate timer count is maintained indicating that three hours remain before the monthly test is conducted.

In some implementations, the processor 201 can delay a test following a loss of building power 210 until the battery 204 is recharged or until a maximum delay limit is reached. Following performance of the test in which the fixture passes the test, the processor 201 indicates the passing status via the user interface components 208, such as through a green status indicator. If the test was not successful, the processor 201 indicates the failing status via the user interface components, such as through a red status indicator. In some implementations, the processor 201 may also indicate (e.g., with a yellow status indicator) based on a test not being able to be performed at the scheduled time, such as during an extended building power outage.

Status indicators can be visual indicators such as displays, e.g., LCD or LED displays, LED indicators. Status indicators can also be audible indicators such as buzzers, sound alerts, alarms, etc. Status can also be indicated via wireless communication to another device, such as a message transmitted via a point-to-point wireless communications channel during a provisioning session.

In some embodiments, the timer may be set, reset, and expire multiple times during the course of testing. For example, the processor 201 may set the timer for an initial period of time. At the first expiration of the timer, the processor 201 may cause the lighting element to be illuminated, for example, on battery power. The processor 201 may reset the timer for a modified period of time. At the expiration of the modified timer, for example, a test may be initiated. For example, at expiration of the modified timer, the processor 201 may initiate a test of the light fixture for the predetermined duration. The processor 201 further configures the user interface to indicate a result of the test via the user interface. The processor 201 further resets the timer, based on the test being successful for the light fixture. The testing now operates on an interval corresponding to the modified period of time.

Figure 3:
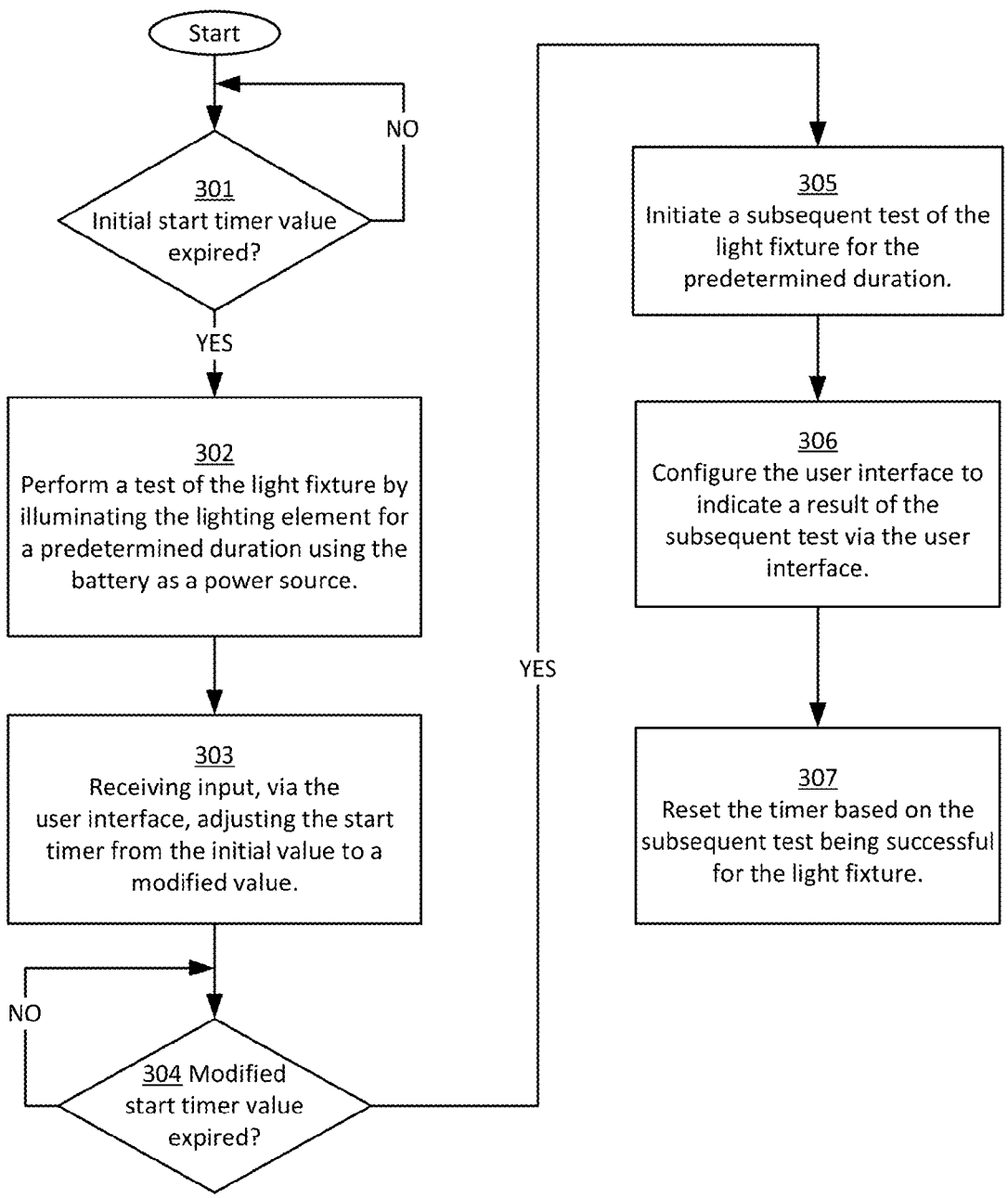
FIG. 3 is an example of a method for testing a light fixture on a modified time interval, according to certain aspects of the present disclosure.

FIG. 3 is an example of a method for testing a light fixture on a modified time interval. At block 301, method 300 involves detecting, using the clock, an expiration of a start timer having an initial value. If the start timer has not expired, then method 300 returns to block 301. If the timer value has expired, then method 300 passes control to block 302.

At block 302, method 300 involves performing, responsive to the expiration of the start timer having the initial value, a test of the light fixture, wherein the test comprises illuminating the lighting element for a predetermined duration using the battery as a power source.

At block 303, method 300 involves receiving input, via the user interface, adjusting the start timer from the initial value to a modified value. The input may be received via a user interface. For example, a user may select the input value using a button, touch sensitive display, etc.

The timer value may be relative to a current time. For example, a user adjusts the timer value to be a time period (e.g., one hour, one day, 30 days, etc.) that is offset from the current time. In that case, the timer expires after the time period following the current time value has expired. In some aspects, relative time values can be used if the user interface involves simple interface elements, such as a tactile button, an infrared remote, etc.

In other embodiments, the timer value may be an absolute, or calendar time. For example, the user may adjust the timer value to be 12 noon. If the current time is 10 am, for example, then the timer would expire two hours later. Alternatively, a user could adjust the timer value to represent a day and time, such as "every third Saturday at 9 pm," or "Oct. 2, 2016 at 12 pm"). In some aspects, these types of time values can be used if the user interface involves more detailed interface elements, such as a display device, a connection to a mobile device during a provisioning session, etc.

At block 304, method 300 involves checking whether the start timer having a modified value has expired. If the start timer has not expired, then method 300 returns to block 305. If the timer value has expired, then method 300 passes control to block 305.

At block 305, method 300 involves initiating a subsequent test of the light fixture for the predetermined duration.

At block 306, method 300 involves configuring the user interface to indicate the result of the subsequent test via the user interface. As discussed, the user interface can be a display, flashing indicator light, or other interface element. For example, the result may be indicated to the user via some kind of visual representation such as a colored and/or flashing status indicator.

At block 307, method 300 involves resetting the start timer, based on the subsequent test being successful for the light fixture. The testing may continue to operate on a schedule according to the modified timer value.

For illustrative purposes, FIG. 3 depicts an example in which a value of the start timer is modified after an initial test using an initial start timer value. But other implementations that omit one or more operations depicted in FIG. 3 are possible. For instance, certain aspects can involve testing a light fixture with a user-configurable start timer without performing an initial test. In these aspects, blocks 301 and 302 can be omitted or replaced by an operation for loading an initial timer value. Input can be received that modifies a value of the start timer from the loaded value to a modified value before a test of the light fixture is performed. The command could be processed to modify the timer value. The remaining blocks 305-307 can be performed with the modified value.

The foregoing is provided for purposes of illustrating, describing, and explaining aspects of the present invention and is not intended to be exhaustive or to limit the invention to the precise forms disclosed. Further modifications and adaptation of these embodiments will be apparent to those skilled in the art and may be made without departing from the scope and spirit of the invention. Different arrangements and combinations of the components and functionality described above, as well as those not shown or described are possible. Similarly, some features and sub-combinations are useful and may be employed without reference to other features and sub-combinations. Embodiments of the invention have been described for illustrative and not restrictive purposes, and alternative embodiments will become apparent to readers of this patent.

The invention claimed is:

1. A light fixture comprising:
    a lighting element;
    a battery;
    a clock; and
    a processor configurable via a user interface, wherein the processor is configured to:
        detect, using the clock, an expiration of a start timer having an initial value;
        perform, responsive to the expiration of the start timer having the initial value, a test of the light fixture, wherein the test comprises illuminating the lighting element for a predetermined duration using the battery as a power source;
        receive input, via the user interface, adjusting the start timer from the initial value to a modified value; and
        perform, responsive to an additional expiration of the start timer having the modified value, operations comprising:
            initiating a subsequent test of the light fixture for the predetermined duration;
            configuring the user interface to indicate a result of the subsequent test via the user interface; and
            resetting the start timer, based on the subsequent test being successful for the light fixture.

2. The light fixture of claim 1, wherein the processor is configured to detect a loss of building power and delay the test until one or more of (i) the battery is recharged or (ii) a maximum delay has been reached.

3. The light fixture of claim 1, wherein the processor is configured to perform one or more of (i) using mains power to power the light fixture and (ii) using mains power to recharge the battery.

4. The light fixture of claim 1, further comprising a secondary battery and a clock power regulator, wherein the clock power regulator is configured to maintain power to the clock during a low battery condition using the secondary battery.

5. The light fixture of claim 1, wherein the light fixture further comprises a tactile button configured to adjust the initial value of the start timer when the tactile button is pressed using a predefined sequence.

6. The light fixture of claim 5, wherein the user interface is configured to display the result of the test by illuminating the tactile button.

7. The light fixture of claim 1, wherein the processor is further configured with a limit for adjusting the initial value of the start timer prior to the test.

8. The light fixture of claim 1, wherein the light fixture further comprises a wireless receiving device configured for receiving wireless inputs via a provisioning session between a user device and the light fixture, wherein the processor is further configured to:
   establish the provisioning session with a mobile device,
   receive the input during the provisioning session, and
   responsive to receiving the input, terminate the provisioning session.

9. The light fixture of claim 1, wherein the input adjusting the initial value for the start timer comprises a test start time and the processor is further configured to adjust the start timer to expire at the test start time.

10. The light fixture of claim 1, wherein the modified value comprises one or more of (i) a time entered as a current time or (ii) a time entered as an absolute time.

11. The light fixture of claim 10, wherein the absolute time is configured by selecting a day from a calendar.

12. The light fixture of claim 1, wherein the user interface is configured to indicate the result using a visual indicator.

13. The light fixture of claim 1, wherein the user interface is configured to indicate the result using an audible indicator.

14. The light fixture of claim 1, wherein the user interface comprises an infrared sensor, and wherein the infrared sensor is configured to receive the input.

15. The light fixture of claim 1, wherein the user interface is configured to receive the input from a wireless remote control device.

16. The light fixture of claim 1, wherein the user interface comprises a wireless transceiver, wherein configuring the user interface to indicate a result comprises sending the result to a user device via the wireless transceiver.

17. A method for testing a light fixture on a modified time interval, the method comprising:
   detecting, using a clock, an expiration of a start timer having an initial value;
   performing, responsive to the expiration of the start timer having the initial value, a test of a light fixture, wherein the test comprises illuminating a lighting element for a predetermined duration using a battery as a power source;
   receiving input, via a user interface, adjusting the start timer from the initial value to a modified value; and
   performing, responsive to an additional expiration of the start timer having the modified value, operations comprising:
      initiating a subsequent test of the light fixture for the predetermined duration;
      configuring the user interface to indicate a result of the subsequent test via the user interface; and
      resetting the start timer, the resetting based on the subsequent test being successful for the light fixture.

18. The method of claim 17, wherein the user interface comprises a tactile button, the input adjusting the initial value of the start timer is a sequence of button presses, and the result of the test is indicated visually.

19. The method of claim 17, wherein the input adjusting the initial value for the start timer further comprises a test start time, the method further comprising configuring the start timer is configured to expire at the test start time.

20. The method of claim 17, further comprising, following a loss of building power, delaying the test until one of (i) the battery is recharged or (ii) a maximum delay has been reached.

* * * * *